US005291140A

United States Patent [19]
Wagner

[11] Patent Number: 5,291,140
[45] Date of Patent: Mar. 1, 1994

[54] MIXED DOMAIN SPECTRUM MEASUREMENT METHOD

[75] Inventor: Douglas R. Wagner, Monroe, Wash.

[73] Assignee: Hewlett-Packard Company, Palo Alto, Calif.

[21] Appl. No.: 109,844

[22] Filed: Aug. 19, 1993

Related U.S. Application Data

[63] Continuation of Ser. No. 935,143, Aug. 24, 1992, abandoned, which is a continuation of Ser. No. 710,994, Jun. 6, 1991, abandoned, which is a continuation-in-part of Ser. No. 553,539, Jul. 13, 1990, Pat. No. 5,121,065.

[51] Int. Cl.$^5$ .................. G06F 11/00; H03K 13/02
[52] U.S. Cl. ........................... 324/615; 324/607; 324/603; 324/605; 324/76.38; 324/76.21; 324/76.24; 341/110; 341/120; 341/123
[58] Field of Search ............. 341/110, 120, 122, 123; 364/553, 482, 484, 485, 576; 324/615, 605, 603, 76.38, 76.21, 76.24, 607

[56] References Cited

U.S. PATENT DOCUMENTS

| | | | |
|---|---|---|---|
| 3,875,500 | 4/1975 | Fletcher | 324/615 |
| 3,988,667 | 10/1976 | Roth | 324/615 |
| 4,067,060 | 1/1978 | Poussart | 364/553 |
| 4,713,782 | 12/1987 | Blackham | 364/553 |
| 4,795,963 | 1/1989 | Ueno | 341/120 |
| 4,813,001 | 3/1989 | Sloane | 364/553 |
| 4,839,651 | 6/1989 | Banno | 341/120 |
| 4,860,227 | 8/1989 | Tamamura | 324/615 |
| 5,051,916 | 9/1991 | Benson | 364/553 |
| 5,063,383 | 11/1991 | Bobba | 364/553 |
| 5,121,065 | 6/1992 | Wagner | 364/572 |

OTHER PUBLICATIONS

HP 3563A Operating Manual, Control Systems Analyzer, vol. I, Hewlett-Packard Company, Feb., 1990, pp. 14-10–14-18.

Primary Examiner—Kenneth A. Wieder
Assistant Examiner—Jose M. Solis

[57] ABSTRACT

Aliasing and synchronization difficulties in determining transfer functions in mixed domain (analog and digital) systems are overcome by sampling the analog signal at a higher sampling frequency that the digital signal, and zero filling the set of sampled digital data (if necessary) so that the sampled digital data corresponds to the more densely sampled analog data. By so doing, a single fixed frequency anti-alias filter in the analog channel can be used to avoid aliasing problems in mixed domain measurements over any span of frequencies, up to the entire passband of the filter. The invention is particularly illustrated with reference to measurements both across digital-to-analog boundaries and across analog-to-digital boundaries.

17 Claims, 7 Drawing Sheets

FIG. 2
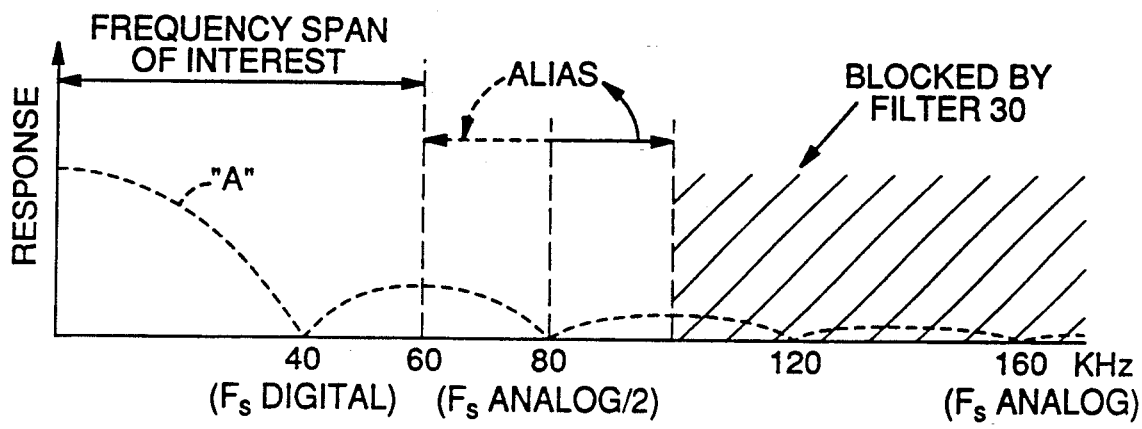
FIG. 3
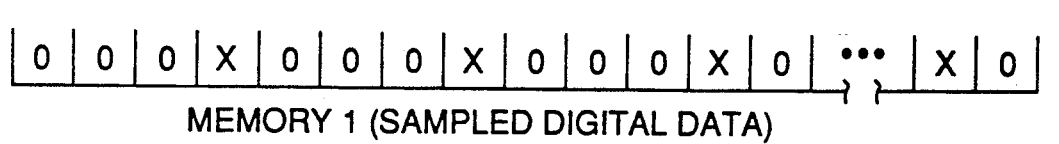
MEMORY 1 (SAMPLED DIGITAL DATA)
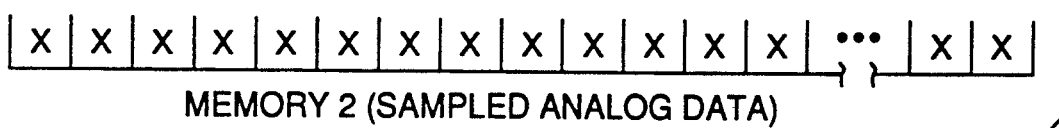
MEMORY 2 (SAMPLED ANALOG DATA)
X = DATA
0 = ZERO FILL FIG. 4   TRANSFER FUNCTION
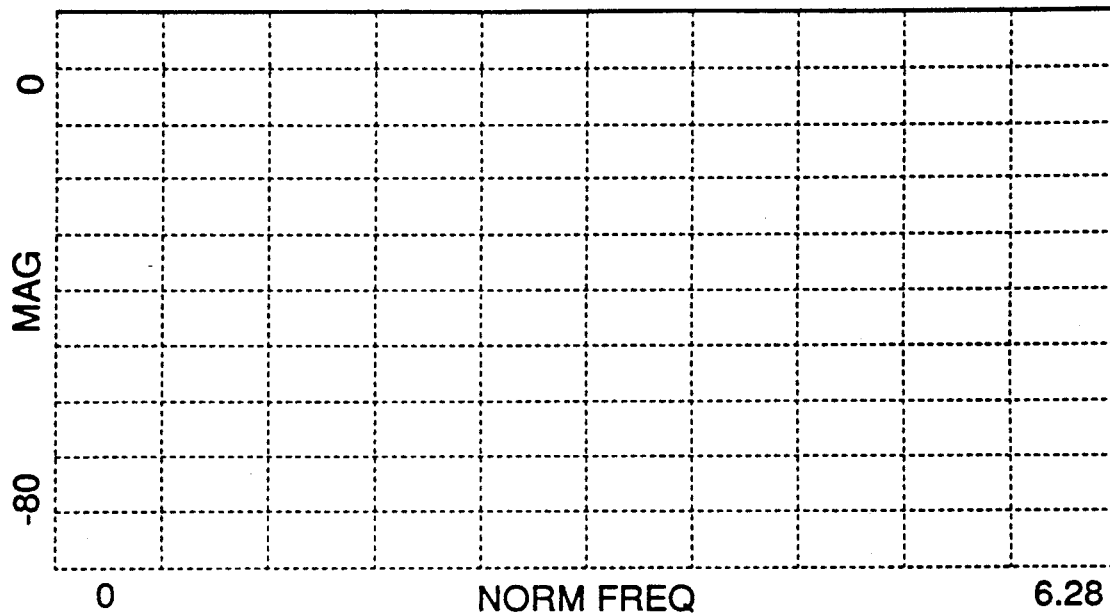
ON BIN
PSUEDO RANDOM
$T_0 = .2$
UNIFORM WINDOW
$$r_{OUT}(n) = \frac{1}{1024} \sum_{k=0}^{512} \cos[k \frac{2\pi}{1024}(n+.2)], T=1$$
FIG. 5   TRANSFER FUNCTION
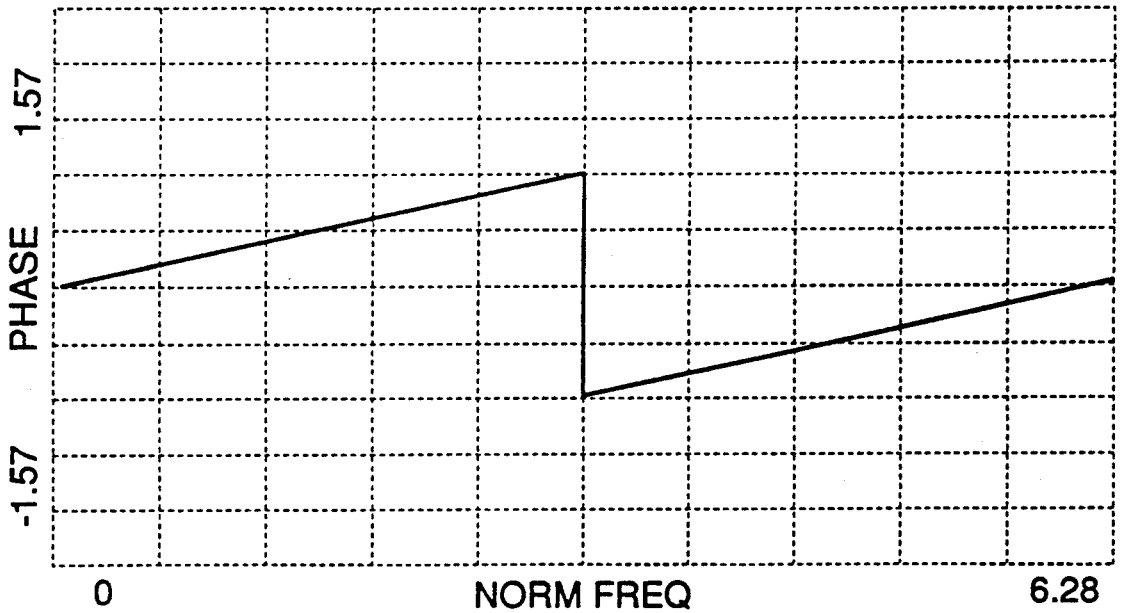
ON BIN
PSUEDO RANDOM
$T_0 = .2$
UNIFORM WINDOW
$$r_{OUT}(n) = \frac{1}{1024} \sum_{k=0}^{512} \cos[k \frac{2\pi}{1024}(n+.2)], T=1$$

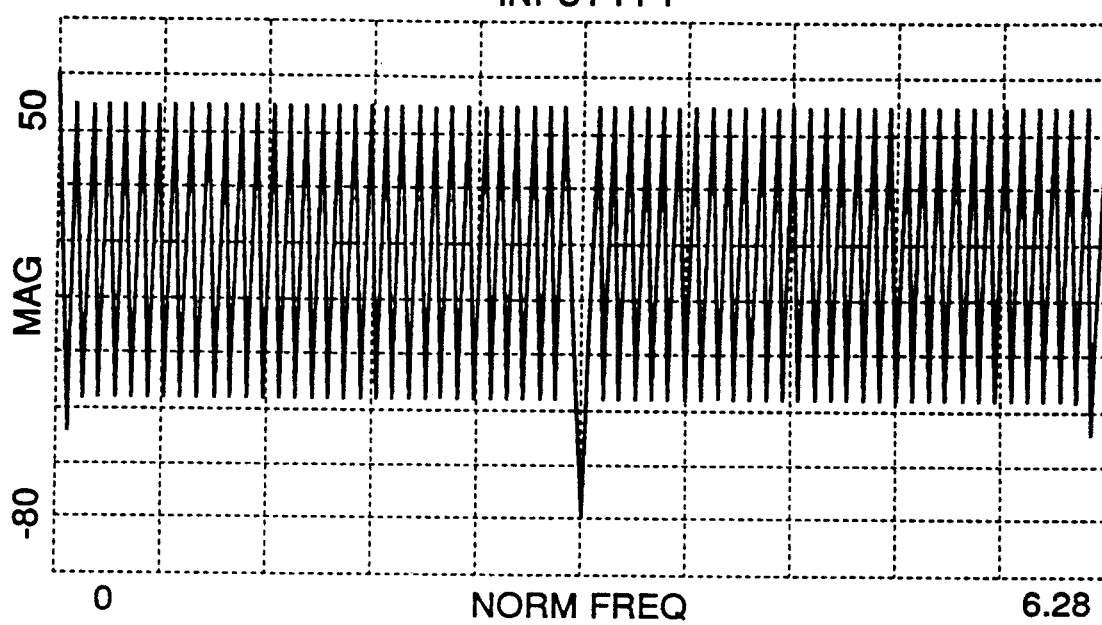
FIG. 6  INPUT FFT
OFF BIN
PSUEDO RANDOM    $r_{OUT}(n) = \frac{1}{64} \sum_{k=16}^{511} \cos[(k \frac{2\pi}{1024} - .003)(n+.2)] + 1, T=1$
$T_0 = .2$
HANNING WINDOW      STEP=16
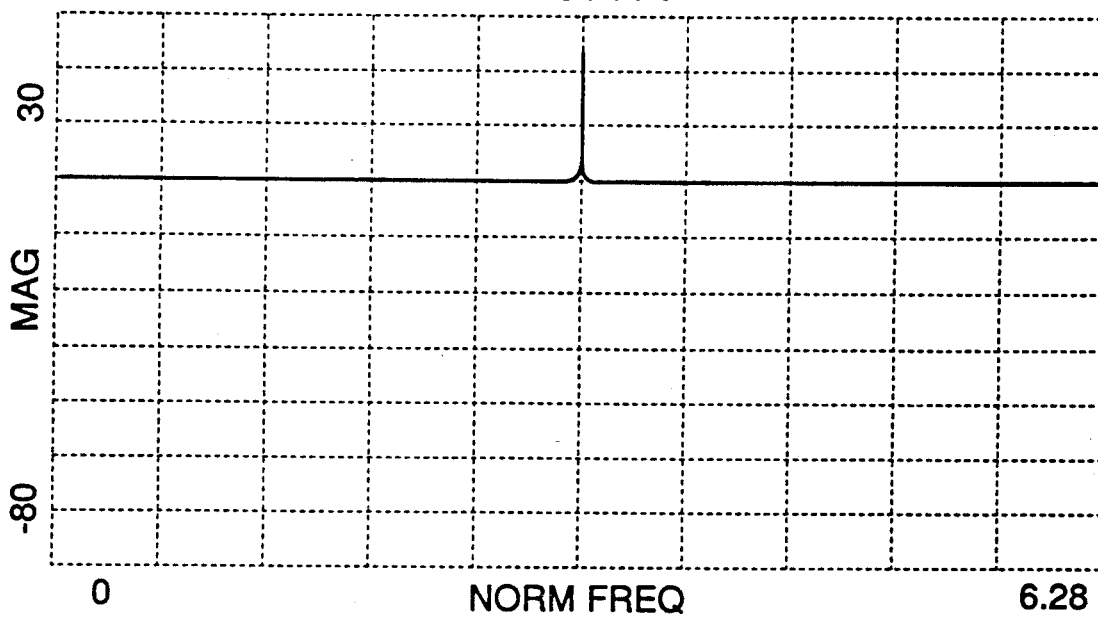
FIG. 7  INPUT FFT
OFF BIN
PSUEDO RANDOM    $r_{OUT}(n) = \frac{1}{64} \sum_{k=16}^{511} \cos[(k \frac{2\pi}{1024} - .003)(n+.2)] + 1, T=1$
$T_0 = .2$
HANNING WINDOW      STEP=16

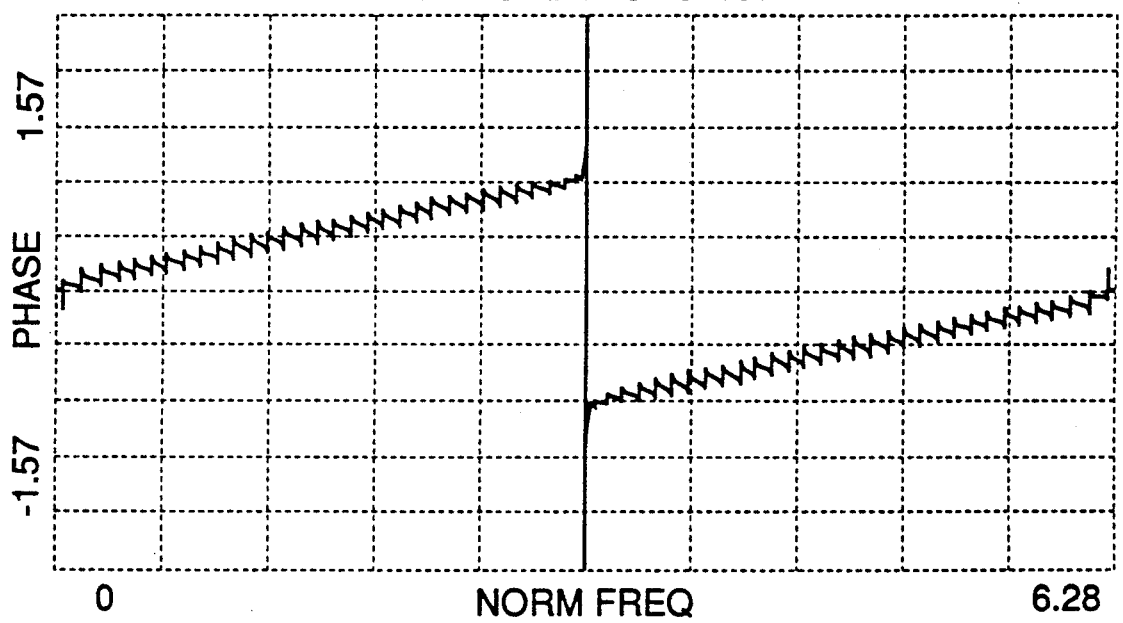
FIG. 8  TRANSFER FUNCTION
OFF BIN
PSUEDO RANDOM
$T_0 = .2$
HANNING WINDOW
$$r_{OUT}(n) = \frac{1}{64}\sum_{\substack{k=16 \\ STEP=16}}^{511}\cos[(k\frac{2\pi}{1024}-.003)(n+.2)]+1, T=1$$

MIXED DOMAIN SPECTRUM MEASUREMENT METHOD

CROSS REFERENCE TO RELATED APPLICATION(S)

This is a continuation of Ser. No. 07/935,143, filed Aug. 24, 1992, now abandoned, which is a continuation of Ser. No. 07/710,994, filed Jun. 6, 1991, now abandoned, which is a continuation-in-part of Ser. No. 07/553,539, filed Jul. 13, 1990, now U.S. Pat. No. 5,121,065.

FIELD OF THE INVENTION

The present invention relates to electronic test and measurement techniques, and more particularly relates to a method and apparatus for measuring characteristics of mixed domain sampled data systems.

BACKGROUND AND SUMMARY OF THE INVENTION

Mixed domain systems are those in which one signal is analog and the other is digital. In characterizing the response of such systems (i.e. the ratio of the output signal spectrum to the input linear signal spectrum), a dual channel signal analyzer may be used, with the digital signal being applied directly to one of the analyzer input channels, and with the analog signal being applied to a second analyzer input channel through an analog-to-digital converter internal to the instrument.

A twofold difficulty arises is making measurements on mixed domain systems. The first is in synchronizing the analog signal sample points with an external clock associated with the device under test used to sample the digital signal. Such synchronization is required to maintain phase accuracy in the resulting measurements. The second difficulty is in providing alias protection for the sampled analog signal. This latter difficulty relates to the phenomenon inherent in sampled data systems wherein the spectrum of a sampled analog signal below one half the sampling frequency is replicated (mirrored) repeatedly around it.

To eliminate the aliasing problem, one approach is to filter the analog signal prior to sampling with an anti-alias filter so as to insure that all spectral components above half the sampling frequency (which would otherwise be mirrored back into the basedband spectrum) are filtered out. However, this is impractical in a general purpose measurement system since the sampling frequency may range over several decades (perhaps 1 Hz to more than 25 KHz). It is difficult and expensive to design an analog filter that can be adaptable to such a broad range of cutoff frequencies.

FIG. 1 illustrates a representative mixed domain system 10 in which these difficulties are encountered, and illustrates a form of the present invention applied thereto. The analysis instrument 12 is a dual channel FFT instrument, such as the Hewlett-Packard 3563A, in which a microprocessor 14 (with associated program ROM 16 and scratchpad RAM 18) performs Fast Fourier Transforms (FFTs) on two channels of sampled input data. These transforms yield Fourier coefficients which are accumulated in "bins," one of which typically corresponds to each element of resolution on a spectral display 20 associated with the instrument. (FFT instruments are disclosed in greater detail in U.S. Pat. Nos. 4,932,062, 4,928,251, 4,918,381, 4,755,795 and 4,713,782, the disclosures of which are incorporated herein by reference.)

The analysis instrument 12 includes a digital signal source 22 that outputs a digital excitation signal. This excitation signal is applied to input channel 1 of the instrument as the reference signal, and is also provided to an external digital filter 24, which has a transfer function D*(s). (The superscripted-* symbology refers to the starred transform. This transform is detailed, inter alia, in Phillips, et al, *Digital Control System Analysis and Design*, Prentice-Hall, pp. 69–75, 106–110 (1984). The non-superscripted-* symbology refers to a convolution operation.) The filter 24 operates with a clock frequency of $F_{s\ digital}$, and has a delay equal to $t_0$ seconds. The filtered digital signal is converted into analog form by a digital-to-analog converter 26, which has a transfer function of $e^{-st_0}[(1-e^{-sT})/s]$. (All digital filters require a finite amount of time to produce a result. This computational delay is modelled here as part of the digital-to-analog converter 26.)

The analog signal from the digital-to-analog converter 26 is applied to an analog circuit 28, which has a transfer function G(s). (The circuit 28 may, for example, be an analog filter circuit.) The analog output signal from circuit 28 is applied to input channel 2 of the instrument, where it is filtered by a low-pass filter 30. The filtered analog signal is converted into digital form for analysis by an analog-to-digital converter (ADC) 32 that samples the analog signal at a frequency $F_{s\ analog}$. (In the illustrated embodiment, all of the clocking/sampling signals are provided by a common clock circuit 34. In other embodiments, the clocking signals used in the mixed domain system 10 need not be synchronized with the analog and digital sampling signals.) The samples applied to the first and second input channels are clocked into a pair of 2048 byte (13-bit bytes) memories 36, 38 internal to the instrument. It is on the sampled data stored in these two memories that the FFT analyses are performed to determine the system transfer function.

The transfer function of the overall FIG. 1 system 10 can be described as follows:

$$Y(s)/E^*(s) = G(s)D^*(s)e^{-st_0}[(1-e^{-sT})/s] \tag{1}$$

where E*(s) is the spectrum of the digital signal source 22, and Y(s) is the spectrum output by the analog circuit 28. (The term "transfer function" is not a technically accurate descriptor of this function due to its mixed domain character. It may more properly be considered a ratio of linear spectrums having practical significance.)

The analysis instrument 12 operates to divide out the E*(s) signal applied to channel 1 from the resultant signal applied to channel 2. However, this E*(s) signal is modified prior to apllication to the analog circuit 28 by the intervening digital filter 24, with its transfer function of D*(s). D*(s) has a periodic spectrum over $1/T = F_{s\ digital}$. The resulting spectrum is further modified by the digital-to-analog converter 26, with its transfer function $e^{-st_0}[(1-e^{-sT})/s]$.

The transfer function of the digital-to-analog converter 26 has a sin(x)/x rolloff (due to its sample and hold operation) which does not filter the replicated spectrum coming from D*(s) beyond $F_{s\ digital}/2$. Thus, if converter 32 samples at the same rate as converter 26, channel 2 will be an aliased measurement. As noted, it is impractical to design a low pass filter whose cutoff frequency can always be adjusted to $F_{s\ digital}/2$, since this represents a wide range of possible frequencies.

In accordance with one embodiment of the present invention, the foregoing aliasing and synchronization difficulties are overcome by sampling the analog channel at an integer multiple of the digital channel, and zero filling the set of sampled digital data so that it corresponds to the more densely sampled analog data. By so doing, measurements across a mixed domain boundary (such as the illustrated digital-to-analog converter 26) can be made to determine frequency response above the classical $F_{s\ digital}/2$ Nyquist limit.

The foregoing and additional features and advantages of the present invention will be more readily apparent from the following detailed description, which proceeds with reference to the accompanying drawings.

BRIEF DESCRIPTION OF THE DRAWINGS

FIG. 2 illustrates certain spectral characteristics of measurements made in the FIG. 1 system.

FIG. 3 illustrates representative digital and analog time records stored in the first and second instrument memories, and illustrates the zero filling used in the digital sample memory.

FIGS. 4-8 are plots of computer simulations of mixed domain measurements across an analog-to-digital boundary.

DETAILED DESCRIPTION

Figure 1:
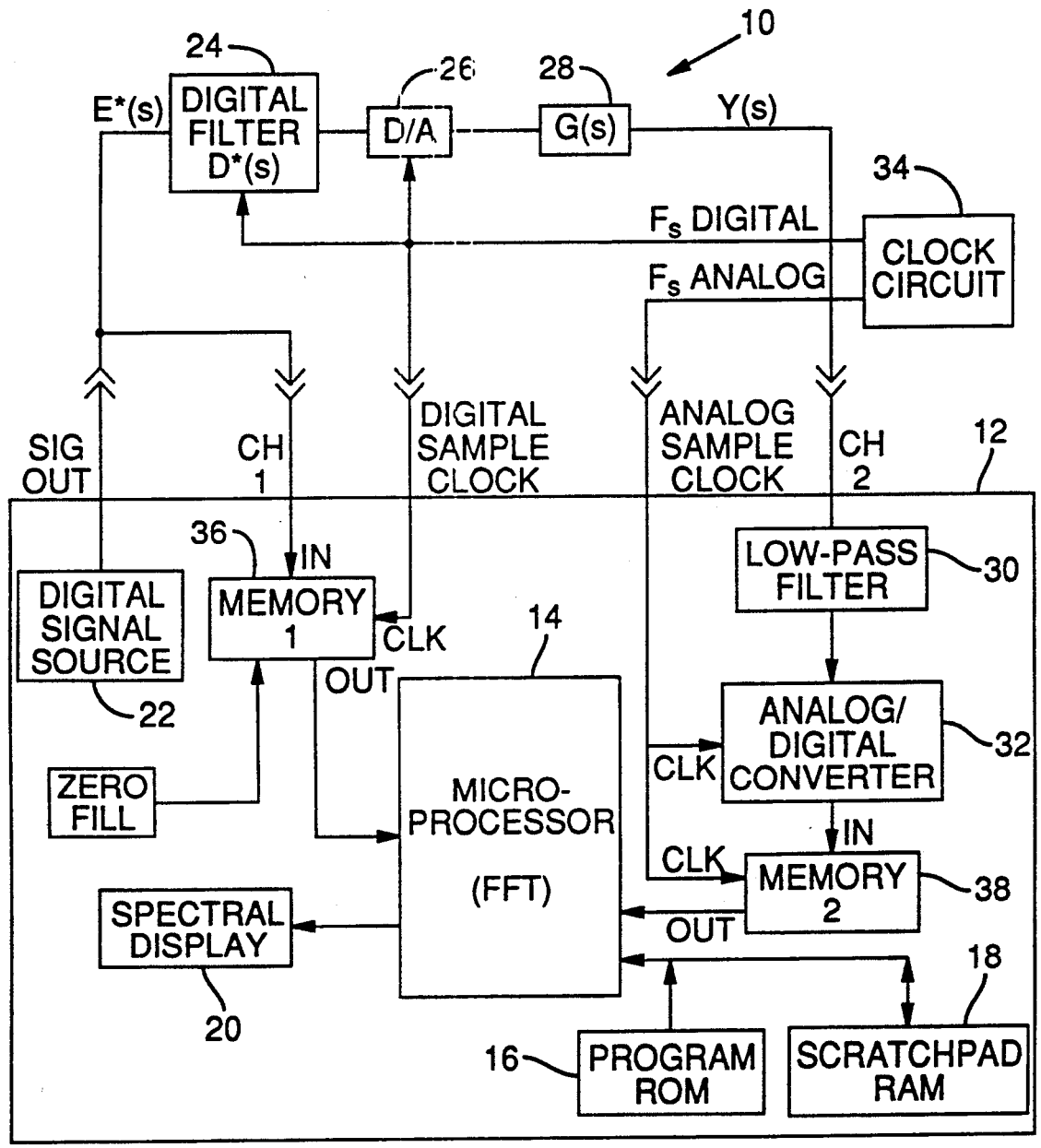
FIG. 1 is a block diagram of a mixed mode measurement system according to a first embodiment of the present invention that may be used to determine a transfer function across a digital-to-analog boundary.

Referring to FIG. 1, the synchronization and aliasing problems noted above are solved by sampling the analog output signal at an integer multiple of the digital input signal, and zero filling the set of sampled digital data so that it corresponds to the more densely sampled analog data set. In the illustrated embodiment, the integral multiple is four. That is, $F_{s\ analog} = 4 * F_{s\ digital}$. The analog and digital sample clocks should be phase locked together but need not be synchronized (i.e. share zero crossings) with a clock signal used in the system under test.

The use of zero filling in the digital data applied to the first channel causes the FFT "bins" resulting from analysis of this data (which is sampled at the slower frequency $F_{s\ digital}$) to spectrally align with the bins resulting from analysis of the sampled analog data (which is sampled at the higher frequency $F_{s\ analog}$) This zero filling is illustrated by FIG. 3, which maps the contents of the analyzer's first and second memories. The first memory (which contains the digital data) has zeroes repetitively interspersed therein to align with the corresponding data in the second memory (which contains the analog data).

FIG. 2 shows the spectral response of a representative digital-to-analog converter 26 when excited with pseudo-random noise (line "A"). In this example, the digital sample frequency $F_{s\ digital}$ is 40 KHz, the analog sample frequency $f_{s\ analog}$ is 160 KHz, the low pass cutoff frequency is fixed at 100 KHz, and the frequency span over which accurate analysis is desired is 0-60 KHz. Aliases of the portion of the analog signal above 80 KHz ($F_{s\ analog}/2$) are mirrored down below 80 KHz. That is, a component of the analog signal at 81 KHz is aliased back at 79 KHz, etc. The spectrum of interest (0-60 KHz), however, is guarded from these aliases by operation of the low pass filter, which attenuates components of the analog signal above 100 KHz (an ideal filter is presumed in this example).

The spectrum of interest between 0 and 60 KHz can be analyzed by "zooming" to see $Y(s)/E^*(s)$ with minimal alias error. ("Zooming" refers to a technique wherein a subband of a digital spectrum can be resolved with accuracy inversely proportional to the size of the subband by use of decimation. Zooming is disclosed, inter alia, in U.S. Pat. No. 4,881,191 and in Thong, "Fourier Analysis of Continuous Data Using DFTs," 1988 IEEE International Symposium on Circuits and Systems, pp. 1907-10, and in deWild et al, "Method for Partial Spectrum Computation," IEE Proc. F, Commun. Radar Signal Process. (UK), Vol.134, No.7 (December, 1987), pp.: 659-66. These disclosures are incorporated herein by reference.)

It will be recognized that the fortuitous circumstance noted above, whereby aliases are excluded from the 0-60 KHz spectrum by operation of the 100 KHz filter, depends on the analog sampling frequency $f_{s\ analog}$ and on the filter cutoff frequency. Basically, aliasing problems are eliminated by selecting $f_{s\ analog}$ so that $F_{s\ analog}/2$ falls at the halfway point between the highest frequency on the display span (i.e. 60 KHz) and the frequency at which the low pass filter provides substantial rejection. (In the illustrated embodiment, this frequency is assumed to be 100 KHz since an ideal filter is assumed.)

Stated another way, the ratio between $f_{s\ analog}$ and $F_{s\ digital}$ (hereafter referred to as the ratio "K") has a lower threshold below which aliasing will interfere with the desired measurement. The minimum ratio, $K_{min}$, can be computed as follows:

$$K_{min} = (F_{span} + F_{LP\ cutoff})/F_{s\ digital} \qquad (2)$$

where $F_{span}$ is the frequency span over which the transfer function is to be analyzed without alias interference (typically the highest frequency to be displayed on the instrument's spectral display), and $F_{LP\ cutoff}$ is the frequency at which the low pass filter 30 provides substantial attenuation. K is here selected by rounding $K_{min}$ up to the next highest integer. If a 60 KHz analysis span is desired using a filter with a cutoff frequency of 100 KHz and with a digital sample rate of 40 KHz, it can be seen that the ratio K must be at least 4. An analysis span arbitrarily close to the theoretical maximum of 0-100 KHz (the passband of the filter 36) can be provided by selecting K to be 5.

By phase locking the analog and digital sample clocks together, the resulting measurement can quantify the mixed domain transfer function in both the amplitude and phase domains. (A phase offset between the clocks is acceptable, provided it is constant over the measurement interval, thereby permitting subsequent processing to remove the phase offset effect. If the phase locking provides synchronous zero crossings, delays associated with the analog signal conditioning can sometimes cause the analog sample to be associated with a different measurement point than the corresponding digital sample.)

From the foregoing, it will be recognized that the present invention permits a single fixed frequency anti-alias filter to be used, in conjunction with ratioed analog and digital sample rates, to permit alias-free mixed domain measurements over any span of frequencies, up to the entire passband of the filter.

In other embodiments of the invention, the sample clocks need not be ratioed; the analog and digital sample clocks can have the same frequency. Surprisingly, they need not be synchronized (in the coincident zero crossing sense) with the clock used in the system under test, although they all generally have the same frequency.

In the illustrated system, the filter 30 is internal to the instrument 12 and cannot be bypassed. This is desirable in the ratioed sampling case since it yields an unaliased measurement. In the case where the sampling clocks have a one-to-one ratio (i.e. the DAC 26 clock rate in the system under test is identical to both the analog and digital sample clock rates), the filter can produce inaccuracies when measuring zero order hold functions of $G(s)$. However, in other applications, this one-to-one ratio produces advantageous results, namely the Z domain step invariant transform of $G(s)$. In this one-to-one case, the system "transfer function" is:

$$Y^*(s)/E^*(s) = [E^*(s)(1 - e^{-sT})G(s)/s]^*/E^*(s) \quad (3)$$

$$= (1 - e^{-sT})[G(s)/s]^* \quad (4)$$

Equation (4) is the step invariant transform of $G(s)$ in the starred transform domain. The corresponding transform in the z-domain is:

$$(1-z^{-1})Z_t\{G(s)/s\} \quad (5)$$

where $Z_t\{G(s)/s\}$ is the impulse invariant transform of $G(s)/s$.

FIGS. 4-8 submitted herewith are plots of computer simulations of mixed domain measurements across an analog-to-digital boundary. They were generated by simulating a sampler circuit followed by a time delay stage. The analog input to the sampler was simulated as being fed to channel 1. The delayed, sampled output from the time delay stage was simulated as being fed to channel 2. The "transfer function" is then determined as the ratio of channel 2 to channel 1.

FIGS. 4 and 5 illustrate the magnitude and phase transfer function when the input signal was simulated to be a series of cosine signals, one centered in each of the uniformly-spaced frequency intervals that define the FFT analysis instrument's "bins." (Only 512 of the instrument's possible 1024 bins were stimulated with such cosine signals to ensure compliance with the Nyquist criterion.) The delay was simulated to be $T_0=0.2$. (This accounts for the 'n+.2' term in the equation associated with FIGS. 4 and 5.) As expected, the transfer function resulting from this simulation is flat in the magnitude domain and is a linear phase ramp in the phase domain.

FIGS. 6-8 portray a simulation similar to that of FIGS. 4 add 5 except the stimulation signal is not centered in each bin. Instead it is offset by 0.003 Hz. (This accounts for the '0.003' term in the equation associated with FIG. 6.) Further, only one-sixteenth as many cosine signals make up the stimulus signal. (This is reflected by the 'STEP=16' legend in FIGS. 6-8.) Since such a stimulus signal is no longer "self-windowing," a Hanning window was imposed to prevent leakage between analysis bins.

FIG. 6 shows the FFT of the analog stimulus signal. (FIG. 6 has no counterpart in FIGS. 4-5, since in that instance the FFT of the analog stimuls signal is simply a flat trace, reflecting the equal amplitude cosine signals, one in each bin.) With a simulated sample period of one second, the magnitude of the transfer function is as illustrated in FIG. 7 and the phase transfer function is as illustrated in FIG. 8. Again, to ensure compliance with the Nyquist criterion, simulated stimulation is provided only up through the 511th analysis bin. (The absence of a signal in the 512th bin causes the anomolies at the center of the FIG. 7 and FIG. 8 plots.)

Figure 9:
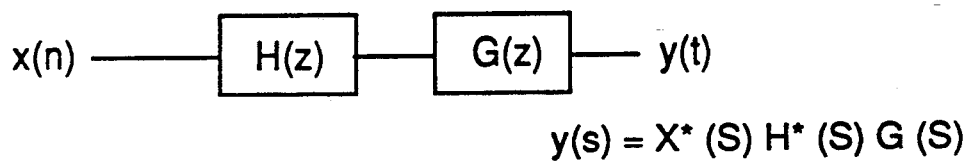
FIGS. 9 and 10 are simplified block diagrams with which certain mathematical derivations are illustrated.

Verification of the system's operation may further be demonstrated with reference to the following discussion, which includes the pertinent mathematical derivations:

As shown in FIG. 9, an object is to measure the response of $H(z)G(f)$. This can be accomplished if $y(t)$ is bandlimited. That is $|G(f)|=0$ for $|f|>B$. If $G(f)$ is not bandlimited, then an anti-alias filter must be added after $G(f)$. The effects of the anti-alias filter can be removed after the measurement.

To measure $H(z)G(f)$, $y(t)$ is sampled at a rate that is an integer multiple of the sample rate for $x(n)$. See FIG. 10. The sampling ratio (the analog sampling rate divided by the digital sampling rate) is again termed K. Before a frequency response can be formed, $x(n)$ must be resampled to a rate equivalent to that used for $y(t)$. This is accomplished by inserting $K-1$ zeros between the sample of the original $x(n)$ sequence. As will be shown, this does not change the spectrum $X(z)$.

Assume that $x^*(f)$ is a sampled version of $x(t)$, where $F_{samp}=1/T$. Then:

$$x^*(t) = \sum_{n=-\infty}^{\infty} x(t)\delta(t - nT) \quad (6)$$

Resampling yields:

$$x^{**}(t) = \sum_{n=-\infty}^{\infty} x^*(t)\delta\left(t - \frac{mT}{K}\right) \quad (7)$$

Substituting for $x^*(t)$ $$x^{**}(t) = \sum_{m=-\infty}^{\infty} \sum_{m=-\infty}^{\infty} x(t)\delta(t - nT)\delta\left(t - \frac{mT}{K}\right) \quad (8)$$

Equation (7) simplifies to $x^*(t)$. While resampling doesn't have any effect using starred transforms, it will cause spectrums generated using FFTs to scale by $1/K$.

Sampling $y(t)$ gives $$y^*(t) = \sum_{n=-\infty}^{\infty} y(t)\delta\left(t - \frac{nT}{K}\right) \quad (9)$$

or $$y^*(t) = y(t) \sum_{n=-\infty}^{\infty} \delta\left(t - \frac{nT}{K}\right) \quad (10)$$

This multiplication in the time domain can be analyzed as a convolution in the frequency domain. Using the following Fourier transform pairs:

$$y(t) \rightarrow Y(f) \tag{11}$$

$$\sum_{n=-\infty}^{\infty} \delta\left(t - \frac{nT}{K}\right) \rightarrow \frac{1}{T} \sum_{m=-\infty}^{\infty} \delta\left(f - \frac{mK}{T}\right) \tag{12}$$

The convolution can be written as:

$$Y^*(f) = Y(f) * \frac{1}{T} \sum_{m=-\infty}^{\infty} \delta\left(f - \frac{mK}{T}\right) \tag{13}$$

Performing the convolution yields:

$$Y^*(f) = \frac{1}{T} \int_{\zeta=-\infty}^{\infty} Y(\zeta) \sum_{m=-\infty}^{\infty} \delta\left(f - \zeta - \frac{mK}{T}\right) d\zeta \tag{14}$$

$$= \frac{1}{T} \sum_{m=-\infty}^{\infty} \int_{\zeta=-\infty}^{\infty} Y(\zeta) \delta\left(f - \zeta - \frac{mK}{T}\right) d\zeta \tag{15}$$

$$= \frac{1}{T} \sum_{m=-\infty}^{\infty} Y\left(f - \frac{mK}{T}\right) \tag{16}$$

This summation can be written as:

$$Y^*(f) = \frac{1}{T} \sum_{m=-\infty}^{-2} Y\left(f - \frac{mK}{T}\right) +$$

$$\frac{1}{T} \sum_{m=-1}^{1} Y\left(f - \frac{mK}{T}\right) + \tag{17}$$

$$\frac{1}{T} \sum_{m=2}^{\infty} Y\left(f - \frac{mK}{T}\right)$$

Since y(t) is bandlimited to B, Y(f)=0 for $|f| > B$. Using the constraint that K/t > B, the first and last summation in the previous equation can be eliminated when only frequencies $|f| < B$ are considered.

Expanding the remaining summation yields:

$$Y^*(f) = \frac{1}{T} \left[ Y\left(f + \frac{K}{T}\right) + Y(f) + Y\left(f - \frac{K}{T}\right) \right] \tag{18}$$

When the following condition is met, $Y^*(f) = Y(f)$:

$$B - \frac{K}{T} < f < \frac{K}{T} - B \tag{19}$$

Figure 10:
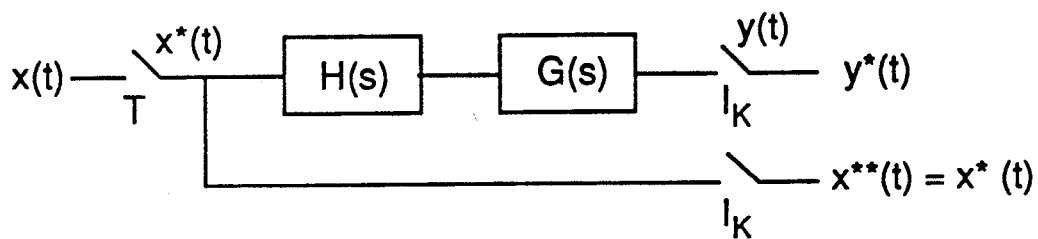

Recall from FIG. 10 that $Y(f) = X^*(f)H^*(f)G(f)$. Dividing by $X^*(f)$ yields the desired result:

$$\frac{Y^*(f)}{X^*(f)} = H^*(f)G(f) \tag{20}$$

Key points:
1. It is not necessary for K/T > 2B. This constraint would only be necessary if it was attempted to reconstruct y(t) from y*(t). The constraint is that K/T > B. This leaves a portion of the spectrum unaliased.
2. In words, H(z)G(s) can be measured from 0 to f Hz where f is the difference between the mixed-ratio sample frequency and the highest frequency component of y(t).

Figure 11:
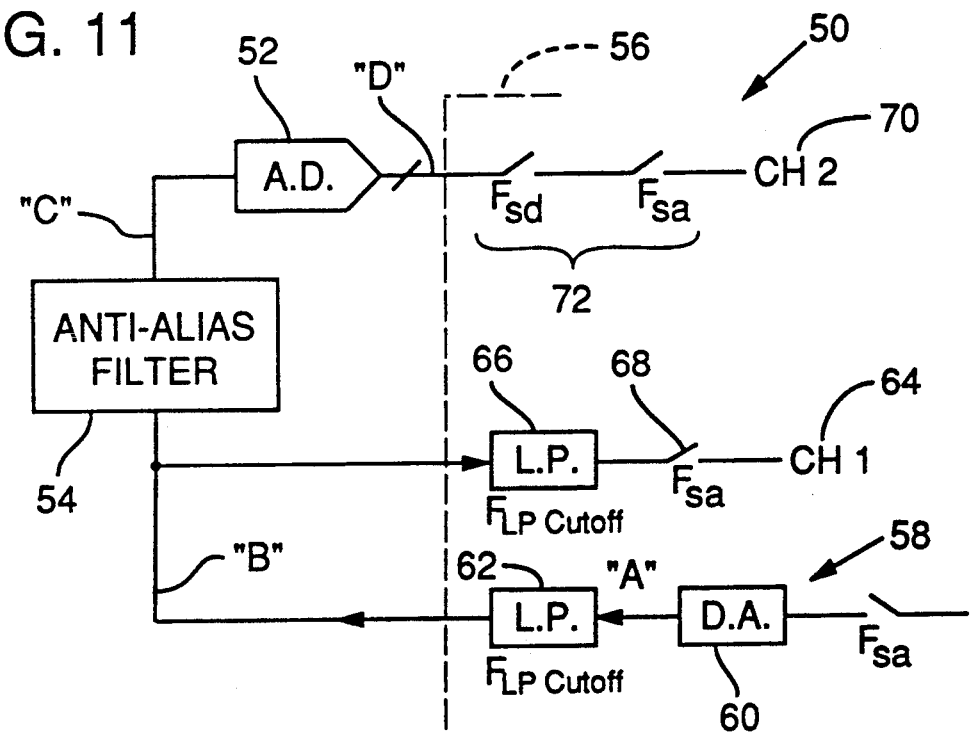
FIG. 11 is a block diagram of a mixed mode measurement system according to a second embodiment of the present invention that may be used to determine a transfer function across an analog-to-digital boundary.

The foregoing discussion has focused on application of the invention to the problem of measuring across a digital-to-analog boundary (i.e. D/A converter 26). However, the principles of the invention are equally applicable to the problem of measuring across an analog-to-digital boundary. Such a system 50 is shown in FIG. 11.

System 50 includes an A/D converter 52, an antialias filter 54, and a measurement instrument 56. The instrument 56 includes a source 58 having a digital-to-analog converter 60 and a low-pass filter 62. The source 58 is driven by a stream of digital signals, which are converted by converter 60 into analog form (labelled "A"). These analog signals are filtered by filter 62, which has a cutoff frequency of $F_{LP\,cutoff}$, and are then provided to line "B."

System 50 further includes a first measurement input channel 64, coupled to line "B" that comprises a low-pass filter 66 (again, of cutoff frequency $F_{LP\,cutoff}$) and a sampler 68. The sampler 68 samples the filtered analog signal at $f_{s\,analog}$.

Finally, system 50 includes a second measurement input channel 70, coupled to the output of the analog-to-digital converter 52, that also includes a sampler 72. The sampler 72 is illustrated here by two samplers, one sampling at $F_{s\,digital}$, and one sampling at $f_{s\,analog}$, to indicate the zero-filling operation discussed earlier.

Again, the equation for determining the minimum sample ratio, $K_{min}$, is identical to that in the earlier, D/A boundary case:

$$K_{min} = (F_{span} + F_{LP\,cutoff})/F_{s\,digital} \tag{21}$$

Figure 12:
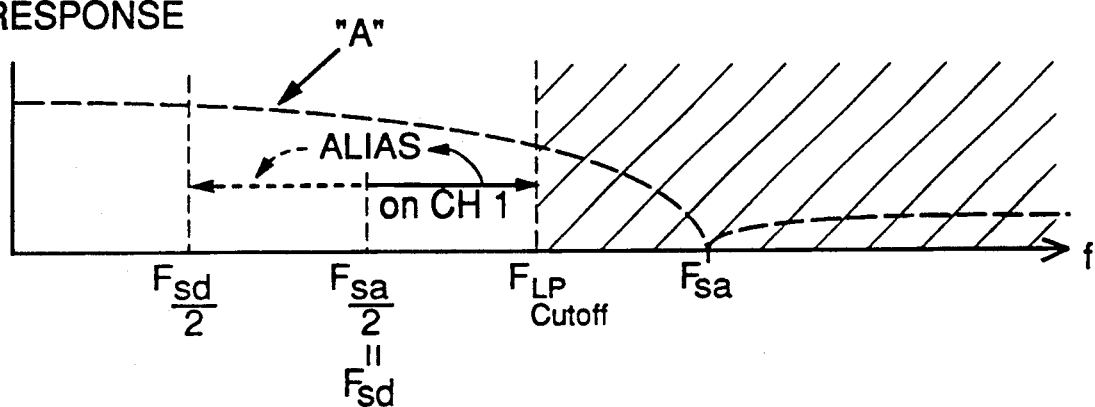
FIGS. 12 and 13 illustrate certain spectral characteristics of measurements made by the FIG. 11 system.
Figure 13:
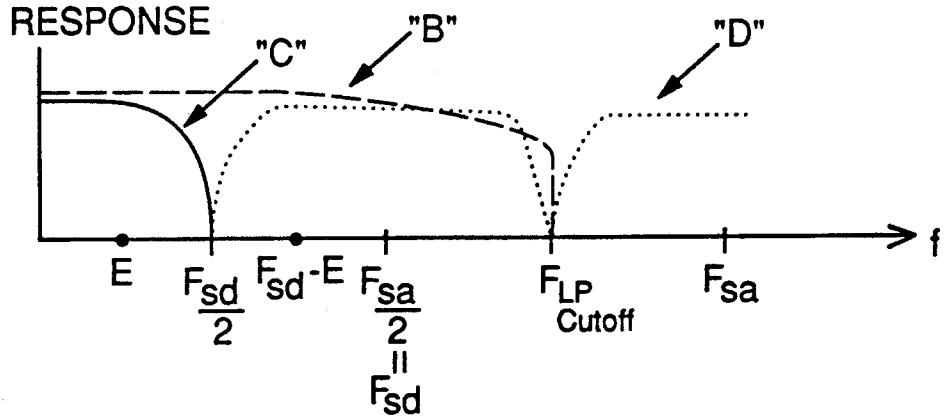

In the case illustrated in FIGS. 12 and 13, with the cutoff frequencies of filters 62, 66 being set to $3F_{s\,digital}/2$, it can be seen that $K_{min}$ equals two.

Unlike the D/A boundary case, here the frequency span of interest will typically be restricted to less than $F_{s\,digital}/2$. This is due to the non-linearity of measurement across A/D boundaries above $F_{s\,digital}/2$. For example, energy at a frequency E (below $F_{s\,digital}/2$) would be seen on the first input channel 64 only at frequency E (FIG. 13). The low pass filter 66 prevents aliasing of this signal up above $F_{s\,analog}/2$. However, on the second input channel 70, the energy at frequency E would be mirrored and replicated at, for example, $F_{s\,digital}-E$. This phenomenon corrupts any transfer function-like measurement above $F_{s\,digital}/2$ since energy will be replicated into parts of the spectrum in channel 2 for which there is no energy in channel 1. Absent complete association of the energy in channel 2 with the energy in channel 1, the resulting transfer function measurement is meaningless.

The operation of the system 50 is illustrated by the spectral plots of FIGS. 12 and 13, where the ratio K is 2 (i.e. the analog sample clock $F_{s\,analog}$ is twice the digital sample clock $F_{s\,digital}$). In FIG. 12, the dashed curve labelled "A" illustrates the spectrum of the signal provided from the instrument source 58 prior to filtering by filter 62. The spectrum of the signal above $F_{LP\,cutoff}$ is blocked by filter 62 in the source 58. The spectrum between $f_{s\ analog}/2$ and $F_{LP\ cutoff}$ is aliased below $F_{s\ analog}/2$ in the first channel 64 due to its $f_{s\ analog}$ sampling rate. However, signals below $F_{s\ digital}/2$ are alias-protected.

In FIG. 13, the dashed curve labelled "B" illustrates the spectrum of the signal provided by the instrument source 58 onto line "B" (i.e. after filtering by filter 62). The solid line "C" illustrates this spectrum after filtering by the external anti-alias filter 54. The dotted line "D" represents the Z domain replication of the signal "C" above $F_{s\ digital}/2$.

Under certain conditions, the system 50 of FIG. 11 can omit the external anti-alias filter 54, provided the following two constraints are met:

$$F_{span} < (F_{s\ digital} - F_{LP\ cutoff}); \text{ and} \quad (22)$$

$$F_{span} < F_{s\ digital}/2 \quad (23)$$

Under these conditions, the instrument low-pass cutoff filters 62, 66 suffice to prevent aliasing.

Having described and illustrated the principles of my invention with reference to several illustrative embodiments, it will be recognized that the invention can be modified in arrangement and detail without departing from such principles. For example, while the invention has been illustrated with reference to a system in which the sample clocks are integrally related, and zero filling is used to align the frequency bins resulting from analysis of the two data channels, in other embodiments this need not be the case. For example, if zero filling is not used, the Fourier coefficients produced from the first and second channels will usually be spaced with different frequency increments. However, their ratios can nonetheless be computed at the points they have in common. Further, in this non-zero filling case and in the non-integral ratio case, interpolation may be employed to estimate spectral response data at points for which data is not directly available. Similarly, while the invention has been illustrated with a base band analysis system, it will be recognized that the principles of the invention are readily applicable to systems in which a spectrum of higher frequency signals are analyzed by frequency translation. Similarly, zoomed transfer function measurements may be made across D/A boundaries. Again, the maximum frequency in the zoomed display acts as the highest frequency of interest. (In this case, the terminology of $F_{span}$ for span of interest is unfortunate since the zoomed span is not relevant to the calculation of K.) Finally, while the invention has been illustrated with reference to a pseudo-random digital excitation signal, it will be recognized that other types of excitation signals can alternatively be used.

In view of the many possible embodiments to which the principles of my invention may be put, it should be recognized that the detailed embodiments are illustrative only and should not be taken as limiting the scope of my invention.

Rather, I claim as my invention all such embodiments as may come within the scope and spirit of the following claims and equivalents thereto:

1. A method of characterizing a response of a mixed domain system to an input signal by using a single measurement instrument, the mixed domain system having both an analog signal and a digital signal, the measurement instrument characterizing the spectral composition of a signal by a Fourier transform method that generates spectral coefficients accumulated in a plurality of data bins, each of said bins corresponding to a particular frequency in a spectrum, the method comprising:

stimulating the mixed mode system with an input signal;

sampling the analog signal in the mixed mode system at a first sampling frequency $F_1$ using a first sampling clock signal;

processing the sampled analog signal in the measurement instrument to obtain a spectral representation thereof, said spectral representation comprising a first set of coefficient data accumulated in data bins;

sampling the digital signal at a second sampling frequency $F_2$ using a second sampling clock signal;

processing the sampled digital signal in the measurement instrument to obtain a spectral representation thereof, said spectral representation comprising a second set of coefficient data accumulated in data bins; and comparing the first set of coefficient data with the second set of coefficient data to determine a transfer function of the mixed domain system;

wherein the first and second sampling clock signals are phase locked but do not have coincident zero crossings.

2. The method of claim 1 in which the frequencies corresponding to the bins in which the first and second sets of coefficient data are accumulated are identical.

3. The method of claim 2 in which the first and second sampling frequencies are identical.

4. The method of claim 1 in which the first and second sampling frequencies are identical.

5. A method of making measurements on a mixed domain system with a single measurement instrument, the mixed domain system having both an analog signal and a digital signal, the digital signal comprising a plurality of binarily weighted data bits representing the amplitude of a signal, the measurement instrument characterizing the spectral composition of a signal by a Fourier transform method that generates spectral coefficients accumulated in a plurality of data bins, each of said bins corresponding to a particular frequency in a spectrum, the method comprising:

sampling the analog signal at a first sampling frequency $F_1$;

processing the sampled analog signal in the measurement instrument to obtain a spectral representation thereof, said spectral representation comprising a first set of coefficient data accumulated in data bins;

sampling the digital signal at a second sampling frequency $F_2$;

processing the sampled digital signal in the measurement instrument to obtain a spectral representation thereof, said spectral representation comprising a second set of coefficient data accumulated in data bins; and comparing the first set of coefficient data with the second set of coefficient data to determine a transfer function of the mixed domain system;

wherein the first and second sampling frequencies are different.

6. The method of claim 1 in which the comparing step comprises determining a transfer function by dividing coefficients in one of said sets of coefficient data with corresponding coefficients in the other of said sets of coefficient data.

7. A method of making measurements on a mixed domain system with a measurement instrument over a frequency span $F_{span}$, said system and instrument comprising an analog signal source, a low pass filter having a cutoff frequency $F_{LP}$ having an input coupled to the analog signal source and an output coupled to a sampling circuit, said sampling circuit having a sampling frequency $F_{s\ analog}$, the system and instrument further comprising an analog-to-digital converting circuit element and a digital sampling circuit having a sampling frequency $F_{s\ digital}$ coupled thereto, the method comprising:

setting a ratio between $f_{s\ analog}$ and $F_{s\ digital}$ to be greater than a limit K, where K is defined by the formula:

$$K = (F_{span} + F_{LP})/F_{s\ digital}.$$

8. The method of claim 5 which further includes:
storing a datum in an analog sample memory once every first period, where said period equals $1/F_1$ seconds;
storing a datum in a digital sample memory once every first period;
wherein the data stored in the digital sample memory comprises samples of the digital signal repetitively interspersed with one or more zeros so as to achieve equal numbers of data stored in the analog and digital memories over a predetermined period of time.

9. The method of claim 8 in which a ratio between the first and second sampling frequencies is an integral ratio.

10. The method of claim 5 in which a ratio between the first and second sampling frequencies is a integral ratio.

11. The method of claim 5 which further includes:
filtering the sampled analog signal to attenuate signals beyond a cutoff frequency $F_{LP}$ that might be aliased back into a frequency span $F_{span}$ of interest and corrupt a measurement.

12. The method of claim 11 in which the frequency span $F_{span}$ can be adjusted without adjusting the cutoff frequency $F_{LP}$ by selecting $F_2$ to be greater than or equal to $(F_{span} + F_{LP})$.

13. The method of claim 1 in which the first and second sampling frequencies are different.

14. The method of claim 13 which includes zero-filling a sparsely sampled data set resulting from the lower sampling frequency so that it corresponds to a more densely sampled data set resulting from the higher sampling frequency.

15. The method of claim 13 which includes setting a ratio between the first and second sampling frequencies to prevent aliasing.

16. The method of claim 1 in which the input signal is the analog signal.

17. The method of claim 1 in which the input signal is the digital signal.

* * * * *